United States Patent [19]
Ishii et al.

[11] Patent Number: 4,725,692
[45] Date of Patent: Feb. 16, 1988

[54] ELECTRONIC DEVICE AND LEAD FRAME USED THEREON

[75] Inventors: Shigeru Ishii, Takasaki; Ichio Shimizu, Tamamura, both of Japan

[73] Assignee: Hitachi, Ltd., Tokyo, Japan

[21] Appl. No.: 865,979

[22] Filed: May 22, 1986

[30] Foreign Application Priority Data

May 24, 1985 [JP] Japan ................. 60-110363

[51] Int. Cl.[4] ............................................. H01L 23/12
[52] U.S. Cl. ..................... 174/52 FP; 357/70
[58] Field of Search .............. 174/52 FP; 361/404, 361/405, 421; 357/70; 339/17 C, 17 CF; 439/70

[56] References Cited

U.S. PATENT DOCUMENTS

| 4,084,312 | 4/1978 | Kirk et al. ....................... 357/70 |
| 4,338,621 | 7/1982 | Braun ......................... 174/52 FP |
| 4,482,781 | 11/1984 | Burns ......................... 174/52 FP |
| 4,532,538 | 7/1985 | Wurz ............................. 357/70 |
| 4,598,307 | 7/1986 | Wakabayashi et al. ........ 174/52 FP |
| 4,627,678 | 12/1986 | Biswas ....................... 339/17 CF |

FOREIGN PATENT DOCUMENTS

| 2075958 | 10/1971 | France . |
| 52-45261 | 9/1977 | Japan ........................... 357/70 |
| 56-133858 | 10/1981 | Japan ........................... 357/70 |
| 59-181039 | 10/1984 | Japan ........................... 357/70 |

OTHER PUBLICATIONS

"Current Applications for Miniature and Multi-pin LSI Packages", Jun. 4, 1984, pp. 141-152, Nikkei Electronics, McGraw Hill Inc., translation found in Serial #865,979.

Primary Examiner—Anthony T. Grimley
Assistant Examiner—D. A. Tone
Attorney, Agent, or Firm—Antonelli, Terry & Wands

[57] ABSTRACT

An electronic device having a first type of external leads with a mechanical strength enhanced therefor and a second type of external leads smaller in a mechanical strength as compared with that of the first type of external leads. The mechanical strength of the first type of external leads is enhanced by making a width or a diameter of the first type of external leads larger than the width or the diameter of the second type of external leads, and the first type of external leads are disposed near edge portions or corner portions of the electronic device having a rectangular sealing means. Then the second type of external leads are disposed between the first type of external leads.

25 Claims, 19 Drawing Figures

ELECTRONIC DEVICE AND LEAD FRAME USED THEREON

BACKGROUND OF THE INVENTION

The present invention relates to an electronic device and a lead frame thereof and particularly to a semiconductor device having a plurality of outer leads and the lead frame thereof.

A semiconductor device is formed of a chip supporting means, a semiconductor chip fixed on the supporting means, a plurality of leads arrayed around the chip, wires for connecting electrically the chip and the leads, and a sealing means for sealing partly the chip supporting means, the chip, the wires and the leads. The leads have internal leads (or inner leads otherwise) sealed around and external leads (or outer leads otherwise) coming out of the sealing means. A mounting of the semiconductor device is carried out generally by connecting the outer leads to the wiring on a substrate through solder.

Improvements in manufacturing techniques of the semiconductor device has naturally stimulated a realization of high integration and multifunction of a large scale integrated circuit (LSI). A tendency is consequently such that the semiconductor device is pinned too much. However, a small and thin package allowing a high density mounting is still required strongly, and the package is sorted according to the type thereof. The situation is reported in a journal "Nikkei Electronics" published by Nikkei McGraw-Hill Inc., dated June 4, 1984 at pp. 141 to 152.

The semiconductor device for which outer leads come out of a sealer is classified largely into two kinds according to the packaging states of the outer leads. One kind is an outer lead insertion packaging type wherein the outer leads are inserted in holes perforated in a wiring substrate in the course of packaging. For example, a dual in-line package (hereinafter called DIP) wherein the outer leads project in two directions from a sealer side and are bent in the same direction will correspond to the semiconductor device of the outer lead insertion packaging type. Since DIP is mounted with a predetermined interval formed between the wiring substrate and the sealer at the time of packaging, it simplifies replacement. The other kind is a surface packaging type wherein the outer leads are mounted one over another on the surface of a wiring electrode formed on the wiring substrate. A small out-line package (hereinafter called SOP) and a flat package (hereinafter called FP) wherein a soldered surface of the outer leads comes within the same plane with a surface given by the sealer back correspond to the semiconductor device of the surface packaging type. Since SOP and FP are small, thin and lightweight, a high packaging density is realizable, and thus the wiring substrate can be made lightweight and miniaturized preferably thereby.

On the other hand, the semiconductor device is ready for packaging automatically on the wiring substrate by the machine, and as disclosed in the above-cited report, a bend arising on the outer leads may stop the packaging work.

SUMMARY OF THE INVENTION

An object of the invention is to provide an electronic device and a lead frame thereof which are capable of minimizing a bend of external leads (or outer leads).

Another object of the invention is to provide an electronic device and a lead frame which are capable of realizing a multi-pin arrangement.

The above and other objects and novel features will become apparent from a description given in the specification.

A representative one of the invention disclosed herein will be summarized simply hereunder, which is not necessarily limitative.

An electronic device has first type of external leads and second type of external leads. Mechanical strength of the first type of external leads is enhanced, however, and mechanical strength of the second type of external leads is smaller as compared with that of the first type of external leads. The second type of external leads are disposed between the first type of external leads.

Illustrative examples will be given as follows:

(a) A width or a diameter of the first type of external leads is greater than a width or a diameter of the second type of external leads.

(b) The first type of external leads are disposed at edge portions (or corner portion) of a rectangular sealing means.

(c) In the case of external lead insertion mounting type, each of the first type of external leads has a wide portion and a narrow portion. The wide portion abuts on the sealing means, and the narrow portion is positioned at a nose portion of the first type of external leads. Then, the narrow portion is inserted in a hole perforated in the wiring substrate at the time of packaging.

(d) In the above (c) the width of the narrow portion and the width of the second type of external leads are almost equal, and thus a miniaturization and a multi-pin arrangement of the sealing means can be attained.

DESCRIPTION OF THE PREFERRED EMBODIMENTS

With reference to semiconductor devices of surface packaging type and outer lead insertion packaging type (hereinafter simply called IC), the inventors have examined causes of the outer leads being bent. An indirect cause is that an unreasonable force is applied to the outer leads from coming into collision with an inside wall of a conveying chute with a handler increased in mechanical strength or with a stopper in the conveying chute at a mechanical inspection and packaging process after the sealing process. A bend of the outer leads arises increasingly from furthering multi-pin arrangement and high packaging density of a semiconductor device package and mechanization such as inspection process and others after the sealing process. The invention has been made in consideration of the above circumstances. Next, an outer lead bend and its cause will be described with reference to a semiconductor device of each packaging type.

Figure 1A:
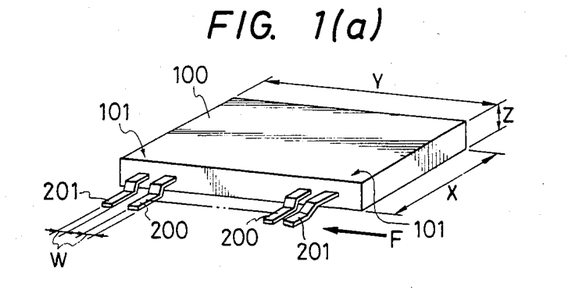
FIG. 1 is a side view for illustrating the controversial points clarified by the inventors.

(a) Controversial points clarified by the inventors (1) Bend of surface packaging type outer leads A perspective view of a small out-line package (SOP) is given in FIG. 1 (a) as IC of a surface packaging type. For high packaging density of SOP, sealer 100 formed, for example, of epoxy resin is made extremely small and thin (X=8.4 mm, Y=15.8 mm, Z=2.5 mm, for example). On the other hand, outer leads 200, 201 projecting from the sealer 100 are extremely slender to have a width W 0.35 mm to 0.4 mm for multi-pin arrangement. Therefore, the outer leads 201, 201 positioned near edge portions 101, 101 of the sealer 100 are ready for bending on a force F indicated by an arrow. The force F may be applied otherwise by a contact of the human hands at the time of inspection.

(2) Bend of outer lead insertion packaging type outer leads

Figure 1B:
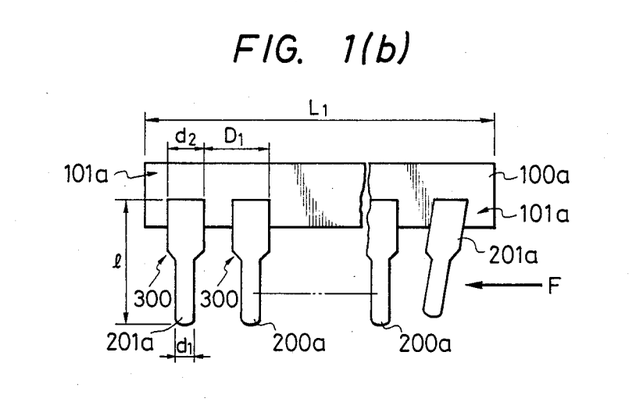

A side view of a dual in-line package (DIP) is given in FIG. 1 (b) as IC of an outer lead insertion packaging type. DIP is a general IC package with outer leads 200a, 201a extending downward, as illustrated, from two opposite sides of a sealer 100a. Since a length l of the outer leads 200a, 201a is as long as 5 mm to 6 mm, they are ready for bending easily on receiving a small force F working on the outer lead 201a according to leverage. The force F arises when the outer leads 201a, 201a near corner portions 101a, 101a of the sealer 100a collide with a stopper disposed in a conveying chute.

Figure 1C:
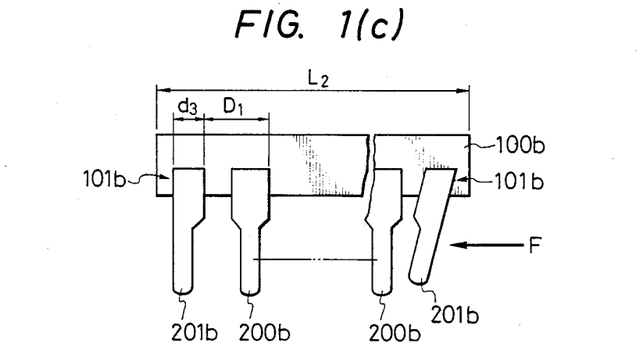

On the other hand, a standard DIP ($d_1$=0.4 mm, $d_2$=1.0 to 1.3 mm, pin pitch $D_1$=100 mils=2.45 mm) shown in FIG. 1 (b) is low in packaging density. The reason is that since a package height decision means 300 which will be described hereinlater is added to all the outer leads 200a, 201a, a length $L_1$ of the sealer 100 cannot be shortened. For the improvement, a package height decision means of outer leads 201b, 201b positioned near edge portions 101b, 101b of a sealer 100b is partly deleted ($d_3$=0.8 to 0.9 mm, $D_1$=100 mils) as shown in FIG. 1 (c), thereby shortening a length $L_2$ of the sealer 100b. In this case, a mechanical strength of the outer lead 201b is small as compared with that of an outer lead 200b, and thus when a force F indicated by an arrow is applied on the outer lead 201b, it is bent more easily than the outer lead 201a shown in FIG. 1 (b).

If an outer lead bend referred to in the above (1) and (2) arises, then an automated packaging device is shut down. The outer lead bend of IC must be corrected accordingly in each occasion, and thus much time and labor will be required for the correcting work.

Next, embodiments of the invention will be described in detail.

(b) Description of embodiments

Figure 2:
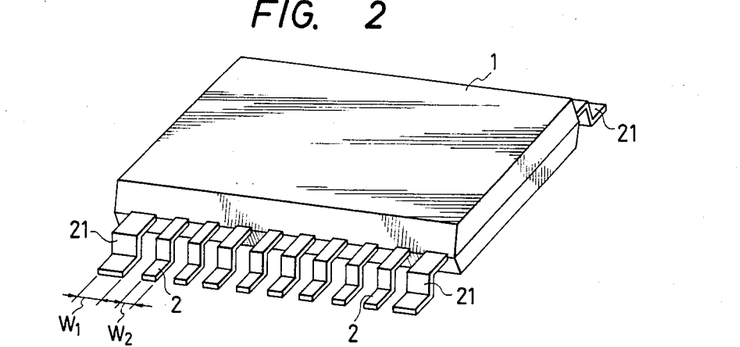
FIG. 2 is a perspective view of an electronic device of surface mounting type (small out-line package) according to the invention, indicating a state where the width of the first type of external leads disposed at edge portions of a sealing means is widened.
Figure 3:
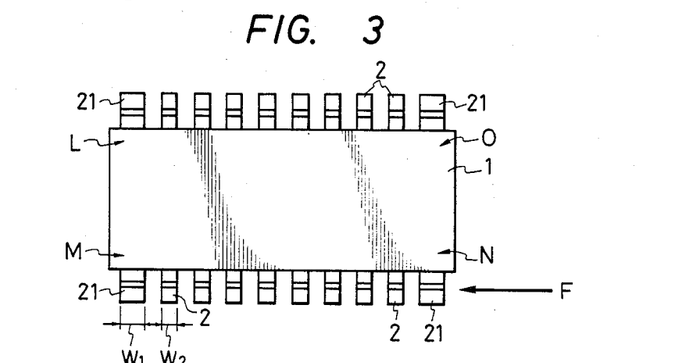
FIG. 3 is a top view of the electronic device (SOP) shown in FIG. 2.
Figure 4:
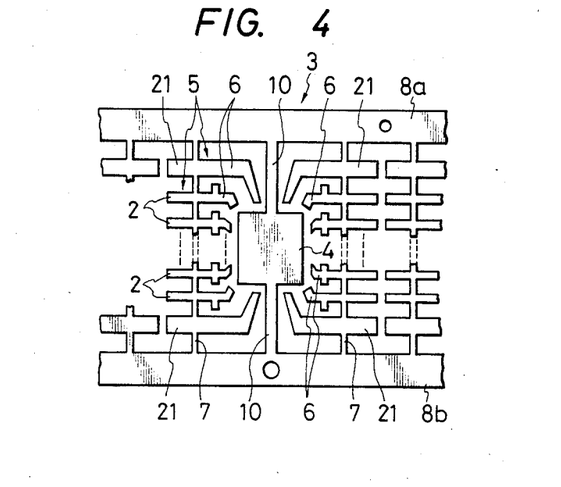
FIG. 4 is a plan view of a lead frame used on the electronic device (SOP) shown in FIG. 2, indicating a stage where the second type of external leads narrow in width are disposed between the first type of external leads wide in width which are positioned outermost.

FIG. 2, FIG. 3 and FIG. 4 represent the case where the invention is applied to a small outline package (hereinafter called SOP) as a semiconductor of surface packaging type. FIG. 2 is a perspective view, FIG. 3 is a top view, and FIG. 4 shows a lead frame of SOP shown in FIG. 2 and FIG. 3.

As will be apparent from FIG. 2 and FIG. 3, SOP is provided with a sealing means 1 formed of a rectangular epoxy resin, and external leads 2, 21 formed of a conductor such as copper, iron alloy or the like come out of a side of the sealing means 1 in two directions. The external leads 2, 21 are constituted of a first type of external leads 21 with an enhanced mechanical strength, and a second type of external leads 2 with a mechanical strength smaller as compared with that of the first type of external leads 21. The mechanical strength will be enhanced by making a lead width $W_1$ of the first type of external leads 21 larger than a lead width $W_2$ of the second type of external leads 2. The first type of external leads 21 are disposed near the four edge portions (or corners L, M, N, O) of the sealer 1, and the second type of external leads 2 are disposed between the first type of external leads 21. Thus, the first type of external leads 21 near corners L, M, N, O corresponding to external leads which are subject to being bent most easily are enhanced for mechanical strength, therefore even the force F, if applied as indicated by an arrow, does not bend them in most cases. Further, the second type of external leads 2 sandwiched between the first type of external leads 21 are weaker than the first type of external leads 21 in mechanical strength but so protected thereby from giving rise to a lead bend.

For simplification, a semiconductor chip, a wire and a plurality of internal leads are not indicated in the drawings.

For enhancement of mechanical strength of the first type of external leads 21, one could conceive of a method which will change the material of the lead 21 to a metal large in mechanical strength. However, the assembling process of the semiconductor device becomes complicated, and hence the method is not realizable. Consequently, mechanical strength of the leads 21 will be enhanced by varying the external leads 2, 21 in the lead width. A multiple lead frame used hitherto for assembling process of the semiconductor device can thus be employed. One example is shown in FIG. 4.

SOP shown in FIG. 2 and FIG. 3 can be formed by means of a lead frame 3 shown in FIG. 4. The lead frame 3 is formed by pressing a conductive thin plate such as copper, copper alloy, iron alloy or the like and constituted of a tab 4 working as a chip supporting means and a plurality of leads 5. Each lead 5 includes an internal lead 6 disposed near the tab 4 and the external lead 2 (21) extending away from the tab 4. Each lead 5 is coupled through a dam 7 and ranges finally to outer frames 8a, 8b. A projection 9 for keeping the leads 5 from coming off after sealing is provided on some of the internal leads 6. On the other hand, the tab 4 is also coupled to the outer frames 8a, 8b through a tab suspension lead 10. For simplicity of the drawing, the lead and the dam are partly omitted as indicated by a dotted line.

As will be apparent from FIG. 4, the first type of external leads 21 are disposed between the outer frame 8a (8b) and the second type of external leads 2. That is, the first type of external leads 21 are provided on the leads 5 positioned to correspond near the corner portions of the sealer after resin sealing.

An assembling process of the semiconductor device will be described as follows. A semiconductor chip is prepared, and the chip is bonded to the tab 4 of the lead frame 3 through an adhesive such as solder, Ag paste or the like. Then, an electrode pad on the desired semiconductor chip is connected electrically to the desired internal lead according to a normal wire bonding process. The wire is formed of a metal such as gold (Au), copper (Cu), aluminum (Al) or the like and is capable of bonding by a thermal bonding or ultrasonic bonding process. Then, the tab 4, the chip on the tab 4, the internal leads 6 and the wires are sealed with resin according to a known transfer mold process. Unnecessary portions (dam 7 and outer frames 8a, 8b) of the lead frame 3 are removed after sealing, and further the external leads are bent as desired to a form shown in FIG. 2.

A mounting on a printed substrate (wiring substrate) is carried out by bonding a lower surface (or soldering surface positioned within the same plane as a lower surface of the sealer) of the first and second types of external leads of SOP shown in FIG. 2 on a desired wiring pattern drawn on the printed substrate and then soldering each external lead Since the sealer is small-sized and thin, IC of the surface packaging type like SOP is advantageous to allow a high density mounting.

Figure 5:
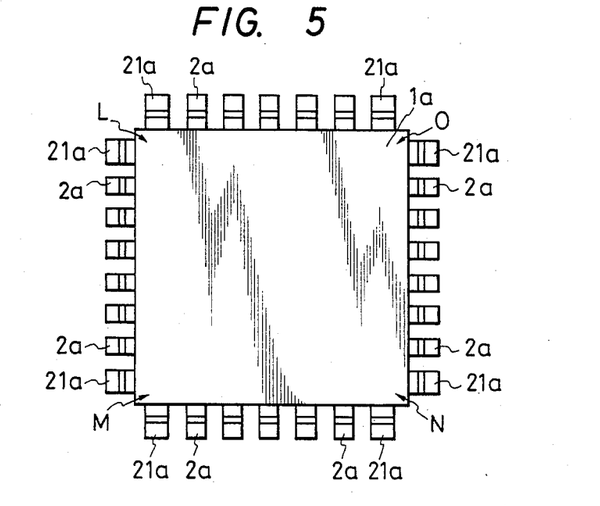
FIG. 5 a top view of an electronic device of another surface packaging type (flat package) according to the invention, indicating a state where first type of outer leads wide in width are disposed at four corner portions of a sealing means.

FIG. 5 is a top view of a flat package (called FP otherwise) which is one of IC's of the surface packaging type to which the invention is applied. As will be understood from the drawing, a first type of external leads 21a wide in lead width are provided near the four corner portions L, M, N, O of a rectangular sealer 1a, and a second type of external leads 2a are disposed between the first type of external leads 21a. What is different from the above-described example is that the external leads 2a, 21a come out of the sealer 1 in the four directions and no more.

Figure 6:
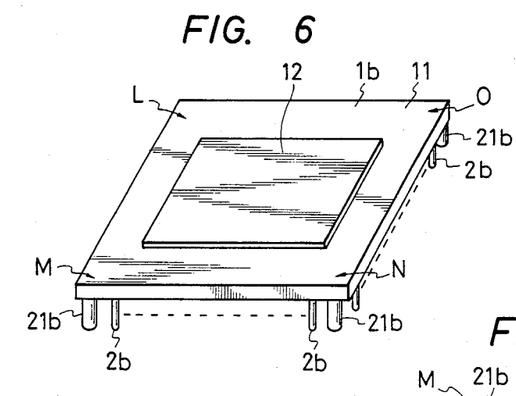
FIG. 6 is a perspective view of an electronic device of outer lead insertion packaging type (pin grid array) according to the invention.
Figure 7:
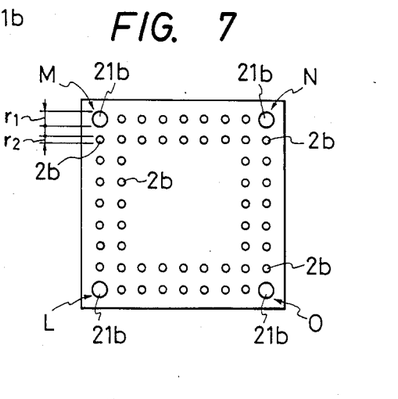
FIG. 7 is a rear elevation of the electronic device (PGA) shown in FIG. 6, indicating a state where first type of outer leads large in diameter are disposed at four corner portions of the sealing means.

FIG. 6 and FIG. 7 are a perspective view and a rear elevation respectively of a pin grid array (hereinafter called PGA) as one example of the semiconductor of an outer lead insertion packaging type to which the invention is applied. PGA has a rectangular base (lead frame) 11 formed of a ceramic material like alumina ($Al_2O_3$) and a cap 12 formed of metal, glass or ceramic bonded and sealed airtightly by means of metal or glass, and thus a sealing means 1b is formed. The sealing method is normally called hermetic seal. The semiconductor chip is fixed on a concavity provided on the base 11 corresponding to a part of the cap 12 by means of an adhesive such as solder or Au-Si eutictec. Internal leads of a metallic thin film like gold or silver which is formed through plating are also provided on a part of the concavity, and desired internal leads and a desired electrode pad on the semiconductor chip are connected electrically through wires. External leads 2b, 21b extending downward of the rear of the base 11 are connected electrically to the desired internal leads. As will be understood from the drawings (FIG. 6 and FIG. 7), a mechanical strength of the first type of external leads 21b positioned near the corner portions L, M, N, O of the base 11 is enhanced to have the diameter $r_1$ formed larger than a diameter $r_2$ of the second type of external leads 2b. The first type of external leads 21b are therefore very hard to be bent by application of a force, if any, thereon.

Figures 8, 9:
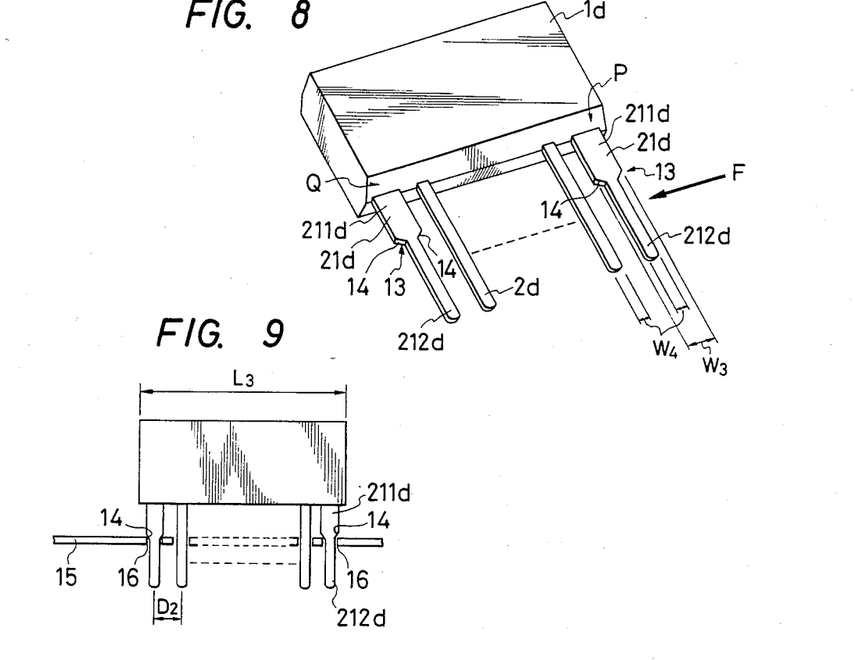
FIG. 8 is a perspective view of an electronic device of outer lead insertion packaging type (single in-line package (SIP)) according to the invention, indicating a state where first type of outer leads having a wide portion and a narrow portion are disposed at edge portions of the sealing means.
FIG. 9 is a side view of the electronic device (SIP) shown in FIG. 8, indicating a state where the height of an electronic device (FP) at the time of packaging is determined on a boundary of the wide portion and the narrow portion.

FIG. 8 is a perspective view of a single inline package (hereinafter called SIP) as one example of the semiconductor device of outer lead insertion packaging type to which the invention is applied. As shown in the drawing, a root lead width of a first type of external leads 21d disposed near edge portions P, Q of a rectangular resin sealer 1d is wider than a root lead width of a second type of external leads 2d disposed between the first type of external leads 21d, and thus the mechanical strength is enhanced accordingly.

Consequently, the first type of external leads 21d are resistant to bending by a force F, if any, which is indicated by an arrow.

On the other hand, a package height decision means 13 is provided only on the first type of external leads 21d. The package height decision means 13 is constituted of an inclined part 14 formed on a boundary of a wide portion 211d corresponding to a root portion of the first type of external leads 21d and a narrow portion 212d corresponding to a nose portion of the first type of external leads 21d.

As shown in FIG. 9, the narrow portion 212d of the first type of external leads 21d and the second type of external leads 2d are inserted in a hole 16 provided beforehand on a printed substrate 15 at the time of packaging, and each external lead is soldered on the printed substrate 15. A package height of SIP is decided accurately on the package height decision means 13. In this case, since the diameter of the hole 16 of the printed substrate 15 is smaller in size than a width $W_3$ of the wide portion 211d and larger than a width $W_4$ of the narrow portion 212d, the inclined part 14 existing on the boundary of the wide portion 211d and the narrow portion 212d comes in contact with the upper surface of the printed substrate 15, and thus the package height is decided.

Further what is characteristic is that since the width $W_4$ of the narrow portion 212d and the width $W_4$ of the second type of external leads 2d are the same in size, and all the packaging holes 16 provided on the printed substrate 15 can be made identical in diameter, a manufacturing process of the printed substrate can be standardized. Further, the package height decision means 13 is removed from the second type of external leads, therefore an interval $D_2$ of each external lead can be narrowed. Consequently, as compared with SIP of a lead number, a package size $L_3$ of SIP according to the invention can be shortened, and a high packaging density will be realizable.

Then, for simplification of representation, a part of the second type of external leads and a part of the printed substrate are omitted in FIG. 8 and FIG. 9.

Figure 10:
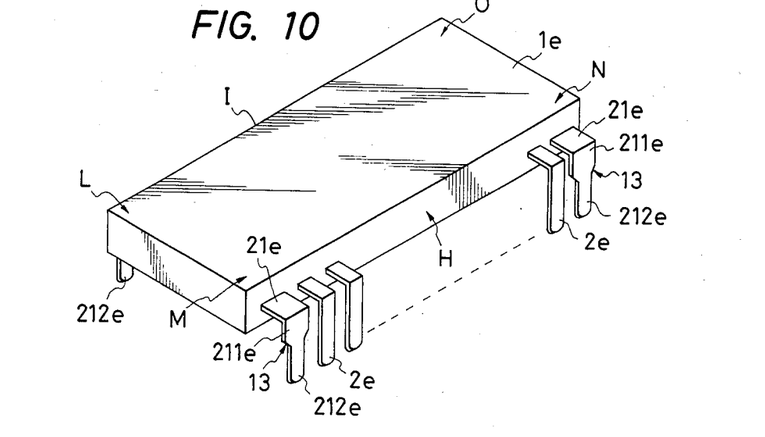
FIG. 10 is a perspective view of a dual in-line (DIP) type electronic device to which the invention is applied.

FIG. 10 represents the case where the invention is applied to a dual in-line package (hereinafter called DIP). What is different from SIP described hereinbefore is that each of external leads 2e, 21e projecting from two opposite sides H, I of a sealer 1e has one bent portion and is bent in the same direction. The first type of external leads 21e disposed near the four corner portions L, M, N, O of the rectangular sealer 1e are enhanced in regard to mechanical strength, each consisting of a wide portion 211e with its root lead width enlarged and a narrow portion 212e continuing to the wide portion 211e and working as a nose portion of the lead. The package height decision means 13 is provided only to the first type of external leads 21e, and the second type of external leads 2e are disposed between the external leads 21e. Then, the sealer 1e can be constituted of a non-airtight sealer formed of epoxy resin or an airtight sealer (hermetic seal) for which two ceramic plates are bonded with glass.

Figure 11:
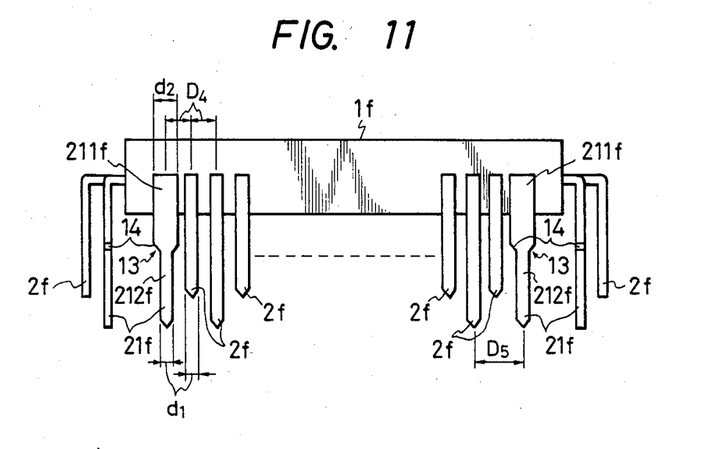
FIG. 11 is a side view of an outer lead insertion packaging type electronic device (quad in-line) to which the invention is applied.
Figure 12:
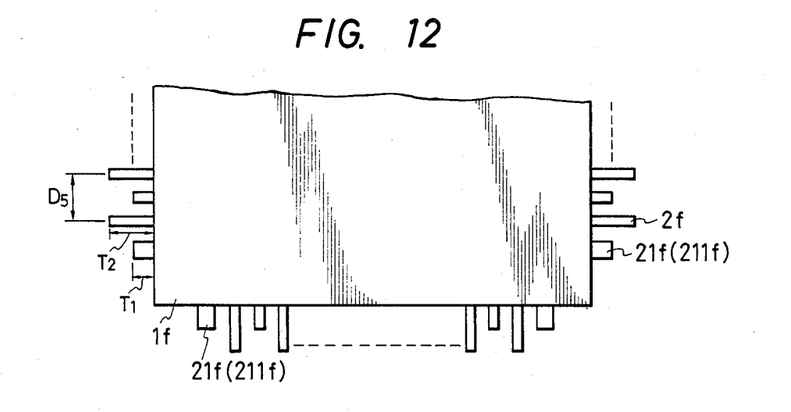
FIG. 12 is a fragmentary top view of the electronic device shown in FIG. 11.

FIG. 11 and FIG. 12 represent an illustrative example of the semiconductor device according to the invention. Then, FIG. 11 is a side view of a multi-pin type resin-sealed semiconductor device (or quad in-line, which is called QIP simply otherwise), and FIG. 12 is a plan view thereof.

A reference character 1f denotes a rectangular resin sealer, which incorporates a semiconductor element pellet tab, a wire and an internal lead therein. Reference characters 2f, 21f represent leads coming externally of the sealer 1f, or external leads, of which the first type of external leads 21f on four corner portions of the sealer 1f consist of a wide portion 211f thick in width $d_2$ of the root and a narrow portion 212f slender in width $d_1$ of the lead nose portion, and the package height decision means 13 is provided thereto. A root portion and a nose portion of the other leads (second type of external leads) 2f are sized the same in width ($d_1$) which is identical with a width $d_1$ of the narrow portion 212f. Each lead has one bent portion and is bent rectangularly, and thus all the external leads face downward. The adjacent external leads 2f, 21f have different positions for their bent portion, and nose portions of the external leads are ready for insertion in packaging holes of the printed substrate which are disposed alternately. Then in the example, width $d_1$ of the narrow portion 212f and the second type of external leads is 0.4 mm, the width $d_2$ of the wide portion 211f is 0.8 mm, and the lead interval $D_4$ is 1.08 to 1.27 mm. As shown in FIG. 12, distances $T_1$, $T_2$ of each bent portion of the external leads 2f, 21f from the side of the sealer are related as $T_1 < T_2$, however, they can be adjusted, needless to say, to $T_1 = T_2$.

QIP is featured as described below.

First, the lead width $d_2$ of the root (wide portion 211f) of the first type of eight external leads 21f positioned near the corner portions L, M, N, O of the sealer 1f which are subject to an outer force is formed large as compared with the lead width $d_1$ of the root portion of other external leads, thus enhancing the mechanical strength. The external leads are hard to be bent, consequently. This may entail no labor for correcting bends of the external leads, and thus the packaging work can be performed at high efficiency.

Further, the second type of external leads are made smaller in width, i.e., the package height decision means 13 is removed from the external leads, therefore the interval $D_4$ between pins (leads) can be narrowed. When the packages are of the same size, a greater number of pin arrangement will be realizable. That is, in a conventional case where the package height decision means 13 is provided to all the external leads, the interval $D_1$ between the external leads is standardized at 2.54 mm or so as shown in FIG. 1 (b). However, according to the invention, a distance between the external leads can be made narrower to the extent of making the distance (pin interval) $D_4$ between center lines of the external leads 1.27 mm, about a half of $D_1$ as shown in FIG. 1(b). This may indicate that the external leads doubled can be allowed in the same package size. In other words, a sealer size for forming a 100-pin package can be contracted by applying the invention. A high packaging density is realizable accordingly.

Furthermore, the distance $D_2$ between the external leads having the same position of bent portion can be made the same as an interval (2.34 mm) between external leads of the conventional standard DIP package by adjusting distances $T_1$, $T_2$ between the bent portion and the side of the sealer 1f as $T_1 = 2.54$ mm $< T_2 = 5.08$ mm as shown in FIG. 12 from varying bent portion positions of the adjacent external leads 2f, 21f. Thus, an interval between the mounting holes to be perforated in the wiring substrate can be standardized, facilitating a fabrication of the wiring substrate.

Further, at the time of packaging, the external leads with the position of a bent portion at $T_1$, namely the external leads having a longer distance from the bent portion to the nose portion and also having the nose portion between a nose portion of the external leads with the position of a bent portion at $T_2$ and the side of the sealer 1f, are inserted first in the holes of the wiring substrate, therefore the packaging work can be carried out with ease while the state of insertion is being ensured, thus enhancing a reliability of the packaging work. Since the external leads with the position of a bent portion at $T_2$ are inserted thereafter in the holes of the wiring substrate, a reliability of the packaging work can be enhanced likewise.

Figure 13:
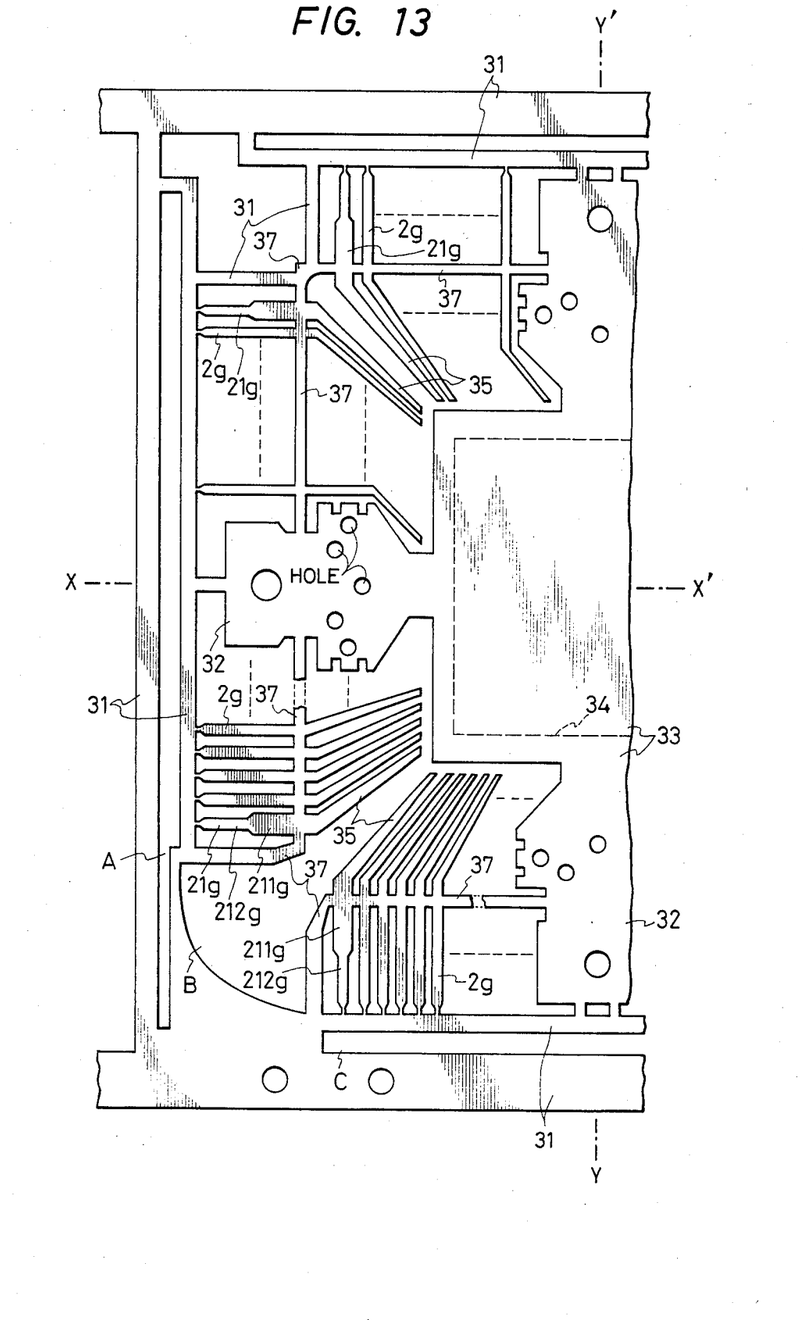
FIG. 13 is a top view showing a part of the lead frame for forming an electronic device with a heat sink, to which the invention is applied.
Figure 14:
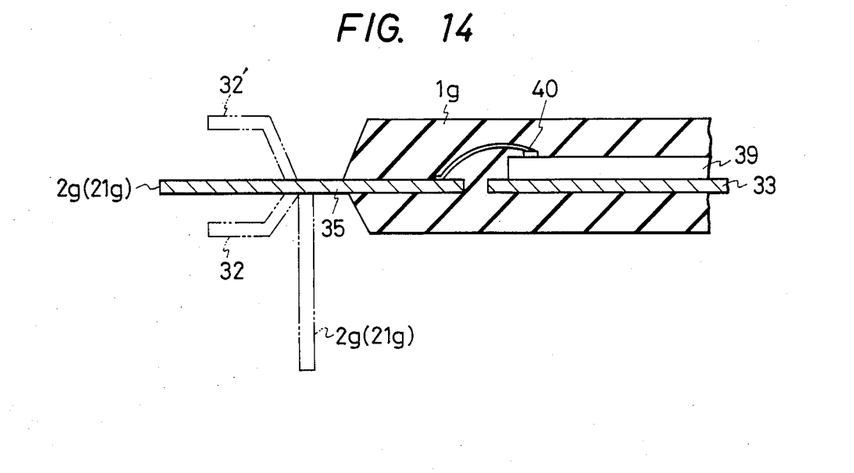
FIG. 14 is a sectional view of the electronic device with a heat sink of FIG. 13 which is formed by means of a lead frame.
Figure 15:
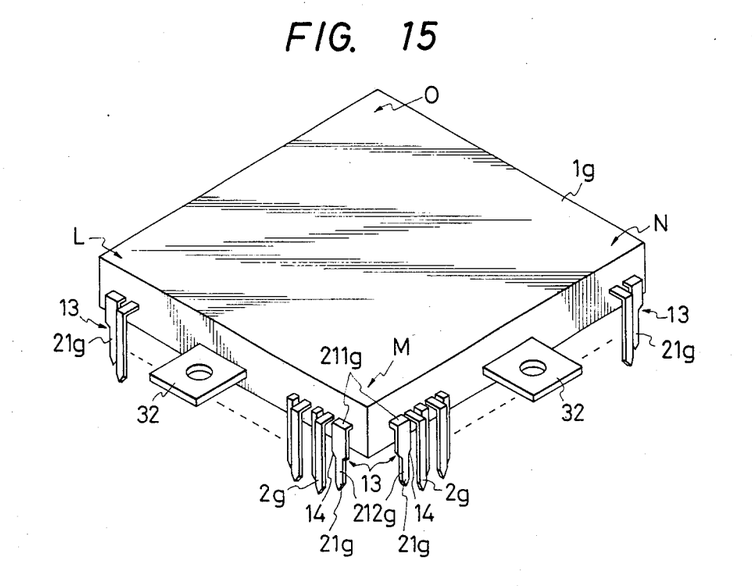
FIG. 15 is a perspective view of the electronic device with a heat sink of FIG. 13 which is formed by means of a lead frame.

FIG. 13, FIG. 14 and FIG. 15 represent another example of the invention. FIG. 13 is a plan view of a main part of the lead frame before a semiconductor element is mounted thereon.

The lead frame is one for a 64-pin QIP resin package, which is integrated with a heat sink.

A reference character 31 denotes an outer frame, 32 denotes a heat sink, and a tab 33 is connected to the central portion as surrounded by four heat sinks 32. A semiconductor element substrate (chip) is mounted on the tab 33 at a position indicated by a dotted line 34 in the drawing. A reference character 35 denotes internal leads of the leads, and 2g, 21g denote external leads. A wide portion 211g and a narrow portion 212g are provided on the first type of external leads 21g, and the package height decision means 13 is also provided thereon. Because of the wide portion 211g existing thereon, the mechanical strength of the first type of external leads 21g is enhanced as compared with the second type of external leads. On the other hand, the first type of external leads 21g are disposed at a portion to be positioned near corner portions of the sealer after sealing.

One of the features of the lead frame is that space zones A, B, C are provided so as to relieve torsion and strain that arise in the lead frame due to a thermal expansion of the lead frame at the time of resin molding. Besides, a multiplicity of holes are provided in the heat sink to enhance a moisture resistance after resin sealing.

The lead frame is not symmetrical with reference to a line X-X' but is symmetrical with reference to a line Y-Y'. Concretely a space is not provided at positions symmetrical with reference to the line X-X' of the space B, and a dam 37 continues to keep a mechanical strength of the lead frame.

FIG. 14 is a sectional view showing the state where a semiconductor element has been assembled by means of the lead frame shown in FIG. 13. A reference numeral 39 denotes a semiconductor element (pellet), 40 denotes a wire, and 1g denotes a resin mold body as a sealing means. The dam 33 and the outer frame 31 between the external leads are removed after resin molding, and the external leads 2g (21g) are bent downward at the root portion as indicated by a dotted line in the drawing.

The heat sink can be bent as indicated by a two-dot chain line to a heat sink 32 or 32' in FIG. 14. Further, it can be shaped as shown in FIG. 15 otherwise. An advantage of the case where the heat sink is formed as indicated by 32' in the drawing is that a radiant ray and an electron ray will be prevented by mounting a lead plate or the like on the heat sink 32' when such radiant and electron rays like alpha rays which may cause an erroneous operation of the semiconductor element shower from over the package, thereby preventing the semiconductor element from operating erroneously. If the heat sink is formed as indicated by 32 in the drawing, the heat sink can be fixed directly on a printed wiring board, thus enhancing a radiation effect.

Further, as shown in FIG. 15 by a perspective view, the heat sink 32 can be projected rectangularly to a side of the sealer 1g.

Figure 16:
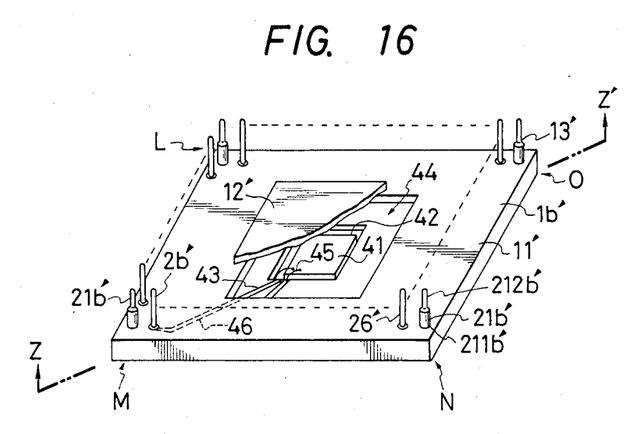
FIG. 16 is a perspective view of an electronic device of outer lead insertion packaging type (pin grid array) according to the invention, indicating a state where the first type of outer leads have a wide portion and a narrow portion.
Figure 17:
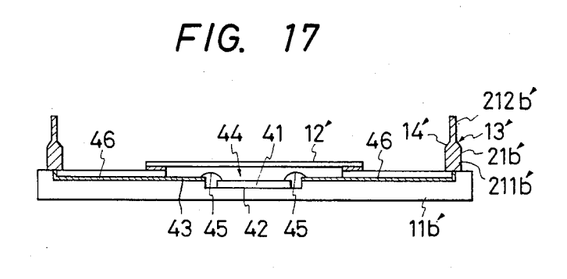
FIG. 17 is a sectional view taken along line Z–Z' of FIG. 16.

FIG. 16 represents the case where the invention is applied to a pin grid array (PGA), which is a perspective view showing the state wherein a cap 12' is partly eliminated. FIG. 17 corresponds to a sectional view taken along line Z-Z' of PGA shown in FIG. 16.

A sealer 1b' as a sealing means is constituted of a base (lead frame) 11' and the cap 12'. The base 11' can be formed of a ceramic like alumina. There provided at the center of the base 11' is a concavity 44 including a chip supporting means 42 with a semiconductor chip 41 fixed thereon and internal leads 43 formed of a metallic film such as gold, silver and the like. The chip 41 can be fixed on the chip supporting means 42 with an adhesive such as solder, Au-Si eutectic or the like. An electrode pad provided on the fixed chip 41 is connected electrically to the internal leads 43 through a metallic wire such as gold (Au), copper (Cu) and aluminum (Al). Then, the concavity 44 is sealed internally from the external atmosphere by the cap 12' formed of glass or metal which is bonded through an adhesive.

As indicated by a dotted line in FIG. 16 or by a sectional view of FIG. 17, the internal leads 43 exposed within the concavity 44 are connected to external leads 2b', 21b' electrically through a metallized wiring 46 in the base 11.

On the other hand, external leads include the first type of external leads 21b' for which a mechanical strength is enhanced and the second type of external leads 2b' smaller in mechanical streigth, and the first type of external leads 21b' are disposed near the four corner portions L, M, N, O of the base 11'. Further, the first type of external leads 21b' include a wide portion 211b' and a narrow portion 212b', and a package height decision means is constituted at an inclined part 14' formed on a boundary of the wide portion 211b' and the narrow portion 212b'. The second type of external leads 2b' are disposed between the first type of external leads 21b', and the diameter is identical with a diameter of the narrow portion 212b' of the first type of external leads 21b'.

For simplification of the illustration, PGA shown in FIG. 16 has the second type of external leads 2b and the internal leads 43 omitted partly.

Next typical effects obtainable from the illustrative examples mentioned above will be described.

(1) A mechanical strength of the first type of external leads (21) disposed near corner portions or edge portions of the rectangular sealing means subject most severely to an external force is enhanced and greater than the mechanical strength of the second type of external leads (2), and the second type of external leads are disposed and so protected between the first type of external leads, thus keeping the first type of external leads from being bent unexpectedly.

(2) Time and labor will not be required for correcting a bend of the external leads, consequently.

(3) A shutdown of an automatic packaging device using machines can be prevented owing to (1) mentioned above, thereby securing high efficiency and effect in the packaging work.

(4) The lead width of the second type of external leads can be formed smaller. A multi-pin arrangement can thus be attained by an action of reducing the intervals between the first and second type of external leads.

(5) Since the lead width of the second type of external leads can be formed smaller owing to (1) mentioned above, the dimensions of the sealer can be reduced in case of forming a semiconductor device with a predetermined number of pins.

(6) A high packaging density will be realizable from (5) mentioned above.

(7) Since the mechanical strength of the first type of external leads is enhanced not by changing materials of the lead member but by varying only the lead width with the material remaining the same as that of the second type of external leads, a multiple lead frame obtainable through press working of one metallic sheet can be used at the time of manufacture. Consequently, the assembling process will not be standardized nor changed.

(8) In the case of external lead insertion packaging type, since a package height decision means is provided only on the first type of external leads whose mechanical strength is enhanced, such a semiconductor device is realizable as will keep advantages of the conventional external lead insertion packaging type package, and besides any bending of the external leads will not easily take place.

We claim:

1. An electronic device comprising:
   a semiconductor chip;
   a supporting means for supporting said semiconductor chip;
   a plurality of leads arranged around said chip;
   wires for electrically connecting said leads and said semiconductor chip;
   a sealing means for sealing said supportig means, said semiconductor chip, said wires and a part of said plurality of leads, each of said plurality of leads having internal leads surrounded by said sealing means and external leads extending out of at least one surface of said sealing means;
   wherein some of said external leads extending outwardly from the same surface of said sealing means are a first type of external leads with a mechanical strength improved therefor and others are a second type of external leads with a mechanical strength smaller than said first type of external leads, at least one of said second type of external leads being disposed between said first type of external leads.

2. An electronic device according to claim 1, wherein said supporting means is a tab member, 3. An electronic device according to claim 1, wherein said supporting means is made of a ceramic material.

4. An electronic device according to claim 1, wherein said sealing means is rectangular in surface appearances, and said first type of external leads are disposed near edge portions of said rectangular sealing means.

5. An electronic device according to claim 1, wherein a width of said first type of external leads is larger than the width of said second type of external leads.

6. An electronic device according to claim 1, wherein a diameter of said first type of external leads is larger than the diameter of said second type of external leads.

7. An electronic device according to claim 1, wherein each of said first type of external leads have a wide portion and a narrow portion, said wide portion abutting on the sealing means, said narrow portion standing at a nose portion of said first type of external lead.

8. An electronic device according to claim 7, wherein a width of said narrow portion and the width of said second type of external leads are substantially equal.

9. An electronic device according to claim 1, wherein said sealing means comprises a sealing member formed of a resin.

10. An electronic device according to claim 1, wherein said sealing means provides a hermetic seal.

11. An electronic device according to claim 1, wherein said sealing means encapsulates said electronic device so as to provide a dual-in-line package, said plurality of external leads extending out of opposing side surfaces of said package, said plurality of external leads having at least substantially the same pitch, said second type of external leads having a first width, said first type of external leads having a second width larger than the first width and being disposed at the outermost positions of the plurality of leads extending out of a respective side surface of said package so as to substantially inhibit deformation from an intial shape in response to an external force.

12. An electronic device according to claim 11, wherein said first type of external leads have said second width at least at a portion adjacent said sealing means.

13. An electronic device according to claim 1, wherein said sealing means encapsulates said electronic device so as to provide a rectangular plate-like package, said plurality of external leads extending out of four side surfaces of said package, said plurality of external leads having at least substantially the same pitch, said second type of external leads having a first width, said first type of external leads having a second width larger than the first width and being disposed at the outermost positions of the plurality of leads extending out of a respective side surface of said package so as to substantially inhibit deformation from an initial shape in response to an external force.

14. An electronic device according to claim 1, wherein said sealing means encapsulates said electronic device so as to provide a and rectangular plate-like pin-grid-array package, said plurality of external leads being pins extending out of one opposing major surface of said package, said plurality of external leads having at least substantially the same pitch, said second type of exteral leads having a first diameter, said first type of external leads having a second diameter larger than the first diameter and being disposed proximate to each corner position of said one opposing major surface of said package so as to substantially inhibit deformation from an initial shape in response to an external force.

15. An electronic device according to claim 14, wherein said first type of external leads have said second diameter at least at a portion adjacent said sealing means.

16. An electronic device according to claim 1, wherein said sealing means encapuslates said electronic device so as to provide a single-in-line package, said plurality of external leads extending out of one of the side surfaces of said package, said plurality of external leads having at least substantially the same pitch, said second type of external leads having a first width, said first type of external leads having a second width larger than the first width and being disposed at the outermost positions of the plurality of leads extending out of the one of the side surfaces of said package so as to substantially inhibit deformation from an initial shape in response to an external force.

17. An electronic device according to claim 16, wherein said first type of external leads have said second width at least at a portion adjacent said sealing means.

18. An electronic device comprising:
   a supporting portion for supporting a semiconductor chip;
   a plurality of leads arranged around said supporting portion and having internal leads each disposed proximate to said supporting portion and external leads each extending in at least one direction away from said supporting portion;
   wherein some of said external leads extending in substantially the same direction from said supporting portion are a first type of external leads with a mechanical strength improved therefor and others are a second type of external leads with a mechanical strength smaller than said first type of external leads, at least one of said second type of external leads is disposed between said first type of external leads.

19. A lead frame according to claim 18, wherein said chip supporting means is a tab member.

20. A lead frame according to claim 18, wherein said supporting portion is made of a ceramic material.

21. A lead frame according to claim 18, wherein said first type of external leads correspond to the external leads to be disposed near edge portions of a rectangular sealing means.

22. A lead frame according to claim 18, wherein a width of said first type of external leads is larger than the width of said second type of external leads.

23. A lead frame according to claim 18, wherein a diameter of said first type of external leads is larger than the diameter of said second type of external leads.

24. A lead frame according to claim 18, wherein said first type of external leads have a wide portion and a narrow portion each, said wide portion abutting on the sealing means, said narrow portion standing at a nose portion of said first type of external leads.

25. A lead frame according to claim 24, wherein a width of said narrow portion and the width of said second type of external leads are substantially equal.

* * * * *